(12) United States Patent
Yamamoto et al.

(10) Patent No.: US 6,258,426 B1
(45) Date of Patent: Jul. 10, 2001

(54) ULTRAVIOLET CURING PRESSURE-SENSITIVE ADHESIVE SHEET

(75) Inventors: Shouji Yamamoto; Yoshio Nakagawa; Tatsuya Kubozono; Kouji Akazawa; Kouichi Hashimoto; Takahiro Fukuoka, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/350,887

(22) Filed: Jul. 12, 1999

(30) Foreign Application Priority Data

Jul. 27, 1998 (JP) .................................................. 10-226516
Mar. 19, 1999 (JP) .................................................. 11-074746

(51) Int. Cl.$^7$ ...................................................... C09J 7/02
(52) U.S. Cl. .......................... 428/40.1; 283/81; 428/40.2; 428/40.4; 428/40.9; 428/41.6; 428/41.8; 428/42.1; 428/156; 428/913
(58) Field of Search ................................ 428/40.1, 40.2, 428/40.4, 40.9, 41.6, 41.8, 42.1, 156, 913; 283/81

(56) References Cited

U.S. PATENT DOCUMENTS

| | | | |
|---|---|---|---|
| 5,232,756 | * 8/1993 | Chang | 428/40.1 |
| 5,843,548 | * 12/1998 | Sanders | 428/40.1 |
| 5,907,018 | * 5/1999 | Mazurek | 525/477 |

FOREIGN PATENT DOCUMENTS

| | | |
|---|---|---|
| 0 436 731 | 7/1991 | (EP) . |
| 0 550 014 | 7/1993 | (EP) . |
| 0 622 833 | 11/1994 | (EP) . |

* cited by examiner

Primary Examiner—Nasser Ahmad
(74) Attorney, Agent, or Firm—Sughrue, Mion, Zinn, Macpeak & Seas, PLLC

(57) ABSTRACT

An ultraviolet curing pressure-sensitive adhesive sheet prepared by forming an ultraviolet curing pressure-sensitive adhesive layer on at least one surface of a substrate film and adhering a separator to the surface of the ultraviolet curing pressure-sensitive adhesive layer, wherein the separator has an ultraviolet transmittance at a wavelength of 300 to 400 nm of 65% or lower. The separator is obtained by forming a layer containing an ultraviolet absorber on the surface of the substrate film opposite the surface adhering to the pressure-sensitive adhesive layer or incorporating an ultraviolet absorber in the film.

The ultraviolet curing pressure-sensitive adhesive sheet is useful as a semiconductor-protective pressure-sensitive adhesive sheet and a semiconductor wafer-fixing sheet, which can be used without causing a curing reaction with the exposure of a slight amount of ultraviolet rays from a surrounding environment at the standby for adhering wafers.

9 Claims, 1 Drawing Sheet

FIGURE
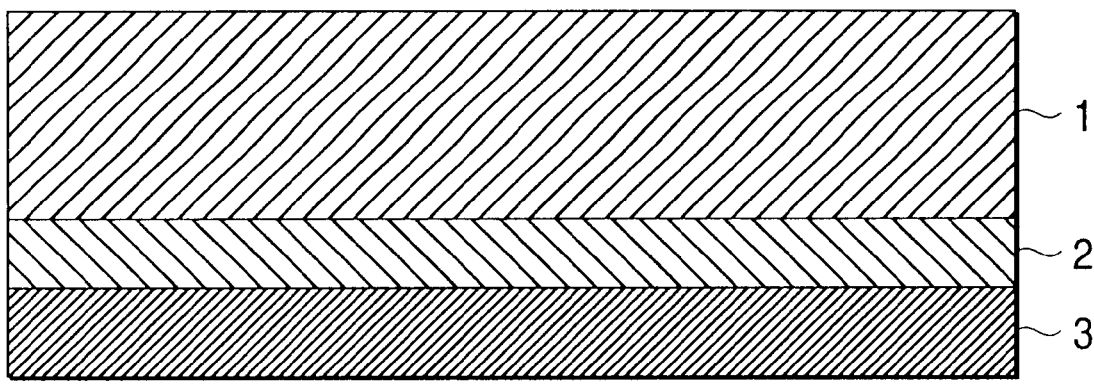

ULTRAVIOLET CURING PRESSURE-SENSITIVE ADHESIVE SHEET

FIELD OF THE INVENTION

The present invention relates to an ultraviolet curing pressure-sensitive adhesive sheet that can be used in various industrial fields. More particularly, the invention relates to an ultraviolet curing pressure-sensitive adhesive sheet useful as, for example, a semiconductor-protecting pressure-sensitive adhesive sheet used for protecting a semiconductor wafer in a grinding step of grinding the semiconductor wafer, a semiconductor wafer-fixing sheet used for fixing a semiconductor wafer by adhering thereto at dicing the semiconductor wafer into small pieces, etc., in the various production steps of semiconductors.

BACKGROUND OF THE INVENTION

In the production process of a semiconductor wafer of silicon, gallium, arsenic, etc., it is general to carry out a back grinding step of grinding a semiconductor wafer having formed thereon a pattern to a definite thickness. In this case, it is a general method that after adhering a pressure-sensitive adhesive sheet, which becomes a semiconductor wafer-protective sheet, to the surface of the semiconductor wafer for the purpose of protecting the semiconductor wafer, etc., the semiconductor wafer is ground. The semiconductor-protecting pressure-sensitive adhesive sheet is released from the ground semiconductor wafer, and after dicing the semiconductor wafer into small element pieces (IC chips), they are transferred to a mounting step which is the subsequent step. In this case, the semiconductor wafer is, in the state of previously being adhered with each pressure-sensitive adhesive sheet, transferred to a bonding step which is the subsequent step through the steps of dicing, washing, drying, expanding, and picking up.

In the pressure-sensitive adhesive sheets used in the steps from the grinding step to the picking up step through the dicing step, it is desired as the above-described semiconductor-protecting pressure-sensitive adhesive sheet that the pressure-sensitive adhesive sheet has a sufficient adhesive force to a semiconductor wafer chip from adhering of the pressure-sensitive adhesive sheet to the completion of grinding and also has an adhesive force of the extent that the pressure-sensitive adhesive does no adhere to the semiconductor wafer chip at releasing the semiconductor-protecting pressure-sensitive adhesive sheet before the dicing step after the grinding step. Also, it is desired as the above-described semiconductor wafer-fixing sheet that the pressure-sensitive adhesive sheet has a sufficient adhesive force to a wafer chip from the dicing step to the drying step and also has an adhesive force of the extent that the pressure-sensitive adhesive does not adhere to the wafer chip at picking up.

As such a pressure-sensitive adhesive sheet, JP-A-60-196956 and JP-A-60-223139 (the term "JP-A" as used herein means an "unexamined published Japanese patent application") propose pressure-sensitive adhesive sheets prepared by coating a pressure-sensitive adhesive comprising a low molecular weight compound having at least two photopolymerizable carbon-carbon double bonds in the molecule, capable of forming three-dimensional network by the irradiation of light on the surface of a substrate. Those proposals are pressure-sensitive adhesive tapes each prepared by coating an ultraviolet-curing pressure-sensitive adhesive on a ultraviolet-transmitting substrate, and are based on the principle that the ultraviolet-curable compound contained in the pressure-sensitive adhesive is cured by ultraviolet rays to impart a three dimensional structure to the pressure-sensitive adhesive, thereby greatly lowering the fluidity thereof. As such a pressure-sensitive adhesive, a pressure-sensitive adhesive wherein sufficient curing is obtained by less illumination and exposure amount is desirable from the points of the speed up of the steps and energy saving. However, when the curing reaction proceeds by less illumination and exposure amount, there are problems that the pressure-sensitive adhesive is cured by a slight amount of ultraviolet rays from the surrounding environment of a fluorescent lamp, etc., at the standby for adhering to a wafer, and thus the pressure-sensitive adhesive cannot adhere to the wafer when adhering the same to the wafer before grinding and dicing, and also the pressure-sensitive adhesive does not show a sufficient adhesive force at adhering to a wafer, causing the problems of releasing or slipping the pressure-sensitive adhesive sheet at grinding, which results in making grinding impossible or causing scattering of chips at dicing.

In more detail, in the above-described semiconductor-protecting pressure-sensitive adhesive sheet and the semiconductor wafer-fixing sheet, after coating the ultraviolet-curing adhesive on at least one surface of a substrate film followed by drying, the surface of the coated pressure-sensitive adhesive layer is generally protected with a film called a separator. As the separator film, considering the surface smoothness, the releasing property, etc., a plastic film such as a polyethylene film, a polypropylene film, a polyester film subjected to a releasing agent treatment, etc., is used.

The product form of the pressure-sensitive adhesive film protected with the separator is usually supplied in the form of being wound in a roll form such that the film is continuously adhered to the semiconductor wafers by an automatic adhering apparatus, etc. Also, at forwarding the product, the product is packed with a light-shielding bag, etc., and is protected so that the pressure-sensitive adhesive is not cured by the exposure of ultraviolet rays from a surrounding environment such as sun light, illumination, etc. At the adhering work by an automatic adhering apparatus, the sheet roll is mounted to a definite position of the apparatus. However, the automatic adhering apparatus itself does not have a function of protecting from the exposure of ultraviolet rays, etc., and thus during using the automatic adhering apparatus, it is always exposed to ultraviolet rays from the surrounding environment. The exposure to a fine amount of ultraviolet rays from the surrounding environment does not give a serious problem in the case of a conventional ultraviolet-curing pressure-sensitive adhesive having a weak reactivity to a fine exposure of ultraviolet rays. However, in the case of the ultraviolet-curing pressure-sensitive adhesive sufficiently curing with a small amount of ultraviolet rays, which has been required at present, the curing reaction proceeds even by the exposure of a fine amount of ultraviolet rays, whereby the problems of the occurrences of inferior grinding at grinding and scattering of chips at dicing, an inferior pick up at picking up, etc., are sometimes caused.

SUMMARY OF THE INVENTION

Accordingly, an object of the present invention is to provide an ultraviolet-curing pressure-sensitive adhesive sheet useful as a semiconductor-protecting pressure-sensitive sheet and a semiconductor wafer-fixing sheet capable of being used with good pressure-sensitive adhesive properties at adhering to semiconductor wafers without causing the reaction of the ultraviolet-curing pressure-sensitive adhesive by the exposure of a slight amount of ultraviolet rays from an surrounding environment such as a fluorescent lamp, etc., at, for example, the standby for adhering to wafers.

As a result of intensive investigations to achieve the above-described object, it has been found that if selectively using a separator having specific characteristics or using a separator subjected to a treatment: of hindering the transmission of ultraviolet rays, and winding separator round the outer surface of the ultraviolet-curing pressure-sensitive adhesive sheet in the form of a sheet roll, the occurrence of curing of the pressure-sensitive adhesive at the standby for adhering can be prevented. The present invention has been completed based on this finding.

According to the present invention, there is provided a ultraviolet-curing pressure-sensitive adhesive sheet comprising a substrate film, an ultraviolet-curing pressure-sensitive adhesive layer formed on at least one surface thereof, and a separator adhered to the surface of the pressure-sensitive adhesive layer, wherein the separator has an ultraviolet transmittance at a wavelength of from 300 to 400 nm of 45% or lower, and preferably the ultraviolet transmittance at a wavelength of 365 nm of 45% or lower.

The ultraviolet-curing pressure-sensitive adhesive sheet can be used as a semiconductor-protective pressure-sensitive adhesive sheet, a semiconductor wafer-fixing sheet, etc.

BRIEF DESCRIPTION OF THE DRAWING

The FIGURE is a schematic cross-sectional view showing an embodiment of the ultraviolet-curing pressure-sensitive adhesive sheet of the present invention.

DETAILED DESCRIPTION OF THE INVENTION

The present invention is described in detail below by referring, if necessary, the accompanying drawing.

The ultraviolet-curing pressure-sensitive adhesive sheet of the present invention comprises a substrate film, an ultraviolet-curing pressure-sensitive adhesive layer formed on at least one surface of the substrate film, and a ultraviolet-shielding separator adhered to the surface of the pressure-sensitive adhesive layer. The FIGURE is a schematic cross-sectional view showing one embodiment of the ultraviolet-curing pressure-sensitive adhesive sheet of the present invention. In the FIGURE, the numeral 1 is a substrate film, 2 is a pressure-sensitive adhesive layer, and 3 is an ultraviolet-shielding separator.

The substrate film is not particularly limited so long as it is a film (including a sheet) can transmit ultraviolet rays, and various films can be used. Usually transparent or translucent plastic films are used. Examples of such a film include a polyethylene film, a polypropylene film, a polybutene film, a polybutadiene film, a polymethylpentene film, a polyvinyl chloride film, a vinyl chloride copolymer film, a polyethylene terephthalate film, a polybutylene terephthalate film, a polyurethane film, an ethylene-vinyl acetate copolymer film, an ionomer resin film, an ethylene-(meth)acrylic acid copolymer film, an ethylene-(meth)acrylic acid ester copolymer film, a polystyrene film, a polycarbonate film, and the crosslinked films of these films. These films may be used as a laminate thereof.

The substrate film has a thickness of generally 10 to 300 $\mu$m, preferably 20 to 200 $\mu$m, and more preferably 30 to 150 $\mu$m. If required and necessary, a conventional physical or chemical treatment such as a releasing agent treatment, a matting treatment, a corona-discharging treatment, a primer treatment, etc., can be applied to the surface of the substrate film.

The ultraviolet-curing pressure-sensitive adhesive layer can comprise conventional ultraviolet-curing pressure-sensitive adhesive composition. Examples of the ultraviolet-curing pressure-sensitive adhesive composition include compositions each containing, for example, (i) a pressure-sensitive adhesive (polymeric elastomer) such as an acrylic pressure-sensitive adhesive or a saturated copolyester, (ii) an ultraviolet-curing component, and (iii) a photopolymerization initiator and, if necessary, conventional additives such as a crosslinking agent, a tackifier, a plasticizer, a filler, an antioxidant, a coloring agent, etc.

In the above-described pressure-sensitive adhesives (i), as the acrylic pressure-sensitive adhesive, a homopolymer of a (meth)acrylic acid ester or a copolymer of the (meth)acrylic acid ester and a copolymerizable comonomer is usually used. Examples of the monomer or comonomer constituting these polymer or copolymers includes alkyl esters (for example, methyl ester, ethyl ester, butyl ester, 2-ethylhexyl ester, and octyl ester) of (meth)acrylic acid, hydroxyalkyl esters (for example, the hydroxyethyl ester and the hydroxypropyl ester) of (meth)acrylic acid, (meth)acrylic acid glycidyl esters, (meth)acrylic acid, itaconic acid, maleic anhydride, (meth)acrylic amide, (meth)acrylic N-hydroxymethylamide, (meth)acrylic acid alkylaminoalkyl esters (for example, dimethylaminoethyl methacrylate and t-butylaminoethyl methacrylate), vinyl acetate, styrene, and acrylonitrile. The main monomer generally used is an acrylic alkyl ester, the homopolymer of which having a glass transition point of $-50°$ C. or lower.

Example of the above-described saturated copolyester can show a saturated copolyester of a polyhydric alcohol and at least 2 kinds of polyhydric carboxylic acids. Examples of the polyhydric alcohol include glycols such as ethylene glycol, propylene glycol, 1,4-butadiene glycol, etc. The polyhydric carboxylic acid includes aromatic dicarboxylic acids such as terephthalic acid, isophthalic acid, etc.; aliphatic dicarboxylic acids such as adipic acid, sebacic acid, etc. As the polyhydric carboxylic acid, the aromatic dicarboxylic acid and the aliphatic dicarboxylic acid are frequently used together.

The ultraviolet-curing component (ii) used may be any monomer, oligomer, polymer, etc., which has a carbon-carbon double bond in the molecule and is curable by a radical polymerization. Examples of the ultraviolet-curable component include esters of (meth)acrylic acid and polyhydric alcohols, such as trimethylolpropane tri(meth)acrylate, pentaerythritol tri(meth)acrylate, tetraethylene glycol di(meth)acrylate, 1,6-hexanediol di(meth)acrylate, dipentaerythritol hexa(meth)acrylate, etc.; ester acrylate oligomers; and cyanurates or isocyanurate compounds such as 2-propenyl di-3-butenylcyanuarate, 2-hydroxyethyl bis(2-acryloxyethyl)isocyanurate, tris (2-acryloxyethyl) isocyanurate, tris(2-methacryloxythyl) isocyanurate, etc.

The photopolymerization initiator (111) may be any substance so long as it cleaves by the irradiation of ultraviolet rays of a proper wavelengths capable of becoming the trigger of the polymerization reaction thereof to form a radical, and examples thereof include benzoin alkyl ethers such as benzoin methyl ether, benzoin isopropyl ether, benzoin isobutyl ether, etc.; aromatic ketones such as benzyl, benzoin, benzophenone, β-hydroxycyclihexyl phenyl ketone, etc.; aromatic ketals such as benzylmethyl ketal, etc.; and thioxanthones such as chlorothioxanthone, dodecylthioxanthone, dimethylthioxanthone, diethylthioxanthone, etc.

The above-described crosslinking agent includes, for example, polyisocyanate compounds, a melamine resin, a urea resin, an epoxy resin, acid anhydrides, polyamine, and carboxyl group-containing polymers.

The ultraviolet-curing type pressure-sensitive adhesive layer has a thickness of generally 3 to 100 μm, and preferably 5 to 50 μm.

The substrate film constituting the separator is not particularly limited so long as it is a film (including a sheet) which can protect the above-described pressure-sensitive adhesive layer, and examples of the substrate film include plastic films such as a polyether ether ketone film, a polyether imide film, a polyarylate film, a polyethylene naphthalate film, a polyethylene film, a polypropylene film, a polybutene film, a polybutadiene film, a polymethylpentene film, a polyvinyl chloride film, a vinyl chloride copolymer film, a polyethylene terephthalate film, a polybutylene phthalate film, a polyurethane film, an ethylene-vinyl acetate copolymer film, an ionomer resin film, an ethylene-(meth) acrylic acid copolymer film, an ethylene-(meth)acrylic acid ester copolymer film, a polystyrene film, a polycarbonate film, etc.

The thickness of the above-described film is usually about 5 to 200 μm, preferably 25 to 100 μm, and more preferably 38 to 60 μm. If necessary, a releasing agent treatment with a silicone-base (including a ultraviolet-curing type), a fluorine-base, a long chain alkyl-base or a fatty acid amide-base releasing agent, a silica powder, etc., may be applied to the surface of the film, to which the pressure-sensitive adhesive layer is to be adhered.

The main feature of the present invention is in the point that the separator has an ultraviolet transmittance at a wavelength of 300 to 400 nm of 65% or lower. The ultraviolet transmittance is preferably 40% or lower. Also, the ultraviolet transmittance of the separator at a wavelength of 365 nm is 45% or lower. The ultraviolet transmittance can be measured by a spectrophotometer.

A practical method of restraining the ultraviolet transmittance of the separator to 65% or lower includes, for example, (a) a method of using, as a separator, a plastic film wherein the ultraviolet transmittance at a wavelength of from 300 to 400 nm is 65% or lower (preferably, the ultraviolet transmittance at a wavelength of 365 nm is 45% or lower ) as the self-acquired property of the film, (b) a method of providing a layer containing an ultraviolet absorber on the surface (back surface) the film opposite the surface to which the pressure-sensitive adhesive layer is adhered, (c) a method of incorporating an ultraviolet absorber in the film, (d) a method of forming a layer containing an ultraviolet absorbing dyestuff on the surface of the film opposite the surface to which the pressure-sensitive adhesive layer is adhered, (e) a method of dispersing an ultraviolet absorbing dyestuff in the film, (f) a method of applying an embossing treatment to the surface of the film opposite the surface to which the pressure-sensitive adhesive layer is adhered such that a haze value becomes at least 20%, (g) a method of forming a layer of inorganic fine particles on the surface of the film opposite the surface to which the pressure-sensitive adhesive layer is adhered, and (h) a method of applying a light-reflecting treatment to the surface of the film opposite the surface to which the pressure-sensitive adhesive layer is adhered.

In the above-described method (a), examples of the plastic film having the ultraviolet transmittance at a wavelength of 300 to 400 nm of 65% or lower (preferably, the ultraviolet transmittance at a wavelength of 365 nm is 45% or lower) as the self-acquired property of the film include a polyether ketone film, a polyarylate film, and a polyethylene naphthalene film.

In the method (b), examples of the ultraviolet absorber include a benzotriazole-base [e.g., 2-(2'-hydroxy-5'-methylphenyl) benzotriazole], a salicylic acid derivative-base (e.g., phenyl salicylate), and a benzophenone-base (e.g., 2,4-dihydroxybenzophenone) ultraviolet absorbers.

The layer containing the ultraviolet absorber can be formed by, for example, preparing a coating liquid by dissolving the ultraviolet absorber in an appropriate organic solvent, if necessary, together with a binder (e.g., a thermoplastic resin), and coating the liquid on the back surface of the film followed by drying. The ratio of the ultraviolet absorber to the binder can appropriately be selected considering the operating property, etc., but the content of the ultraviolet absorber is usually about 5 to 70% by weight, and preferably 20 to 50% by weight, based on the solid content (a mixture of ultraviolet absorber and binder) of the coating liquid. The solid content concentration in the coating liquid may be properly controlled such that a viscosity of the coating liquid becomes a proper viscosity for coating, but is generally about 0.5 to 50% by weight. The thickness of the layer (coated layer) containing the ultraviolet absorber after drying is in the range of preferably about 0.01 to20 μm although the thickness differs according to the amount of the ultraviolet absorber in the coating liquid.

In the method (c), the benzotriazole-base ultraviolet absorber, the salicylic acid derivative-base ultraviolet absorber, the benzophenone-base ultraviolet absorber, etc., as described above can also be used as the ultraviolet absorber. The film containing the ultraviolet absorber can be obtained by previously kneading the ultraviolet absorber in the resin constituting the film and then film-forming the mixture. The compounding amount of the ultraviolet absorber differs according to the kind, etc., of the ultraviolet absorber, but is usually about 0.01 to 10 parts by weight, and preferably 0.5 to 10 parts by weight, per 100 parts by weight of the resin constituting the film.

In the method (d), examples of the ultraviolet absorbing dye include a black dye or pigment, and a yellow dye or pigment. The layer of the ultraviolet absorbing dyestuff can be formed by, for example, coating a commercially available black ink, yellow ink, etc., on the back surface of the film. The concentration and the coating amount of the ink are controlled such that the above-described ultraviolet transmittance of the coated film becomes 65% or lower.

In the method (e), examples of the ultraviolet absorbing dyestuff include a black pigment such as carbon black, etc., and a white pigment such as titanium oxide, etc. The dyestuffs as used in the above-described method (d) may be used as the ultraviolet absorbing dyestuff. The film having dispersed therein the ultraviolet absorbing dyestuff can be obtained by previously kneading the ultraviolet absorbing dyestuff in the resin constituting the film and then film-forming the mixture. The compounding amount of the ultraviolet absorbing dyestuff differs according to the kind thereof, but is usually about 0.01 to 10 parts by weight, and preferably 0.5 to 10 part by weight, per 100 parts by weight of the resin constituting the film.

The method of the embossing treatment in the method (f) may be any method so long as it is a method of giving a haze value of 20% or higher after the embossing treatment. Examples of the method include a method of pressing the film onto an embossing roll, a method of subjecting the film to a sand matting treatment, and a method of subjecting the film to a chemical treatment such as etching, etc. The above-described haze value is preferably 40% or higher.

Examples of the inorganic fine particles in the method (g) include fine particles of an inorganic substance having a light-scattering ability, such as iron oxide, magnetite, titanium oxide, zinc oxide, cerium oxide, etc. In addition, it is suitable that the surfaces of the inorganic particles are coated with a surface active agent such as potassium stearate, potassium laurate, etc., in a monomolecular layer-like state to increase the dispersibility thereof. The particle size of the inorganic fine particles is, for example, about 0.2 to 10 $\mu$m. The layer of the inorganic fine particles can be formed by, for example, dispersing or dissolving the inorganic fine particles in a proper solvent, if necessary, together with a binder (e.g., a thermoplastic resin) to prepare a coating liquid, and coating it to the back surface of the film followed by drying.

The light-reflection treatment in the method (h) may be any method so long as it is a treatment capable of forming a light-reflecting layer. Examples of the method include a vapor-deposition coating treatment with a metal such as aluminum, etc., a simple substance such as silicon, etc., or an inorganic oxide, an inorganic sulfide, an inorganic carbide, an inorganic nitride, etc. The vapor deposition may be a vacuum vapor deposition, a physical vapor deposition such as ion plating, sputtering, etc., or a chemical vapor deposition such as thermal CVD, plasma CVD, photo-CVD, etc.

The ultraviolet curing pressure-sensitive adhesive sheet of the present invention can be produced by, for example, coating a composition containing the ultraviolet curing pressure-sensitive adhesive on the surface of the substrate film followed by drying (if necessary, crosslinking by heating) to form an ultraviolet curing pressure-sensitive adhesive layer, and adhering the separator on the surface of the pressure-sensitive adhesive layer. The ultraviolet curing pressure-sensitive adhesive sheet of the present invention is usually stored in a state of being wound in a roll form, and in the case of using the pressure-sensitive adhesive sheet in a grinding step or a dicing step as a semiconductor-protecting pressure-sensitive adhesive sheet or a semiconductor water-protective sheet, the sheet is, if necessary, rewound. In addition, in the case of winding the sheet in a roll form, the sheet is wound such that the back surface of the separator adhered to the pressure-sensitive adhesive sheet thus wound is exposed to the outer side of the wound sheet in order to exhibit the ultraviolet shielding effect of the separator.

As described above, according to the present invention, the change in the pressure-sensitive adhesive properties by the exposure of a slight amount of ultraviolet rays from a surrounding environment can be restrained, and the stability of the pressure-sensitive properties required in the case of using the ultraviolet curing pressure-sensitive adhesive sheet of the present invention as a semiconductor-protecting pressure-sensitive adhesive sheet (pressure-sensitive adhesive tape for back grinding) and a semiconductor wafer-fixing sheet (pressure-sensitive tape for dicing) is very high, whereby the ultraviolet curing pressure-sensitive adhesive sheet can largely contribute to the improvement of the production yield of semiconductor chips, etc., in the user line.

The present invention is described in more detail by reference to the following examples, but it should be understood that the invention is not construed as being limited thereto.

EXAMPLE 1

60 Parts by weight of dipentaerythritol hexaacrylate ("KAYARAD DPHA", trade name, made by Nippon Kay-aku Co., Ltd.), 5 parts by weight of a radical polymerization initiator ("IRUGACURE" 651, trade name, made by Ciba Special Chemicals Co.) , and a polyisocyanate compound ("CORONATE L", trade name, made by Nippon Polyurethane Industry Co., Ltd.) were added to a solution containing an acrylic copolymer having a number average molecular weight of 800,000 obtained by copolymerizing 85 parts by weight of butyl acrylate and 5 parts by weight of acrylic acid in ethyl acetate to prepare an acrylic ultraviolet curing pressure-sensitive adhesive solution.

The solution was coated on one surface of a polyethylene film having a thickness of 100 $\mu$m the surface of which had been subjected to a corona discharging treatment, and crosslinked by heating to 80° C. for 10 minutes to form an ultraviolet curing pressure-sensitive adhesive layer having a thickness of 10 $\mu$m. A separator obtained by a method shown below was adhered to the surface of the pressure-sensitive adhesive layer obtained above to prepare an ultraviolet curing pressure-sensitive adhesive sheet (usable as a semiconductor-protective pressure-sensitive adhesive sheet and a semiconductor wafer-protective sheet; hereinafter the same) . This sheet was wound in a roll form with the separator facing outside, based on a practical product state.

The above separator was prepared by coating a treatment solution prepared by dissolving 35 parts by weight of an ultraviolet absorber ("TINUVIN 900", trade name, made by Ciba Specialty Chemicals Co.), 100 parts of a polyester resin ("BAYLON V-200", trade name, made by Toyobo Co., Ltd.) as a binder, and 10 parts by weight of melamine resin ("SUPER BECKAMINE J-820", trade name, made by Dai-Nippon Ink and Chemicals, Inc.) in toluene to a surface of a polyester film having a thickness of 38 $\mu$m ("LUMIRROR S-10 #50", trade name, made by Toray Industries, Inc.) opposite the surface to which the pressure-sensitive adhesive layer was adhered, the layer having been subjected to a releasing agent treatment, and dried at 135° C. for 10 minutes to form an ultraviolet absorber layer having a thickness of 0.1 $\mu$m.

EXAMPLE 2

An ultraviolet curing pressure-sensitive adhesive sheet was obtained in the same manner as in Example 1 except that a film obtained by kneading 3 parts by weight of an ultraviolet absorber ("TINUVIN 900", trade name, made by Ciba Specialty Chemicals Co.) in 100 parts by weight of a polyester resin to form a resin composition and forming a film using the resin composition at a thickness of 38 $\mu$m, one surface (the surface adhering to the pressure-sensitive adhesive layer) of which had been subjected to a releasing agent treatment, was used as the separator.

EXAMPLE 3

An ultraviolet curing pressure-sensitive adhesive sheet was obtained in the same manner as in Example 1 except that a polyester film the surface of which adhering to the pressure-sensitive adhesive layer having been subjected to a releasing agent treatment and also the surface opposite the surface adhering to the pressure-sensitive adhesive layer having been coated with a commercially available black ink as an ultraviolet absorbing dyestuff at a thickness of 0.1 $\mu$m to form an ultraviolet absorbing dyestuff layer, was used as the separator.

EXAMPLE 4

An ultraviolet curing pressure-sensitive adhesive sheet was obtained in the same manner as in Example 1 except that a film obtained by kneading 3 parts by weight of an ultraviolet absorbing dyestuff (carbon black) in 100 parts by weight of a polyester resin to form a resin composition and forming a film using the resin composition at a thickness of 38 μm, one surface (the surface adhering to the pressure-sensitive adhesive layer) of the film having been subjected to a releasing agent treatment, was used as the separator.

EXAMPLE 5

An ultraviolet curing pressure-sensitive adhesive sheet was obtained in the same manner as in Example 1 except that a polyester film the surface which adhering to the pressure-sensitive adhesive layer having been subjected to a releasing agent treatment and also the surface opposite the surface adhering to the pressure-sensitive adhesive layer having been subjected to a sand matting treatment such that the haze value became 50%, was used as the separator.

EXAMPLE 6

An ultraviolet curing pressure-sensitive adhesive sheet was obtained in the same manner as in Example 1 except that a polyester film having an inorganic fine particle layer by coating a coating liquid prepared by dissolving silica fine particles (mean particle size 1.5 μm) and 100 parts by weight of a polyester resin ("BAYLON 63SS", trade name, made by Toyobo Co., Ltd.) as a binder in toluene, formed on the surface opposite the surface adhering to the pressure-sensitive adhesive layer at a thickness of about 5 μm, was used as the separator.

EXAMPLE 7

An ultraviolet curing pressure-sensitive adhesive sheet was obtained in the same manner as in Example 1 except that a polyester film the opposite surface of which opposite the surface adhering to the pressure-sensitive adhesive layer having been vapor deposited with aluminum, was used as the separator.

EXAMPLE 8

An ultraviolet curing pressure-sensitive adhesive sheet was obtained in the same manner as in Example 1 except that a polyacrylate film ("EMBLET #50", trade name, made by Unitika, Ltd.) of 50 μm having a ultraviolet transmittance at a wavelength of 300 to 400 nm was 65% or lower (the ultraviolet transmittance at a wavelength of 365 nm was 45% or lower) the surface of which opposite the surface thereof adhering to the pressure-sensitive adhesive layer having been subjected to a releasing agent treatment, was used as the separator.

COMPARATIVE EXAMPLE 1

An ultraviolet curing pressure-sensitive adhesive sheet was obtained in the same manner as in Example 1 except that an ordinary polyester film ("LUMIRROR S-10 #50", trade name, made by Toray Industries, Ltd.) was used as the separator.

COMPARATIVE EXAMPLE 2

An ultraviolet curing pressure-sensitive adhesive sheet was obtained in the same manner as in Example 1 except that an ordinary polypropylene film ("TORAYFAN BO-2500 #40", trade name, made by Toray Industries, Ltd.) was used as the separator.

Evaluation Test

The ultraviolet curing pressure-sensitive adhesive sheets obtained in the Examples and the Comparative Examples were evaluated by the following methods.

(1) Ultraviolet transmittance:

The transmittance of the separator only of each ultraviolet curing pressure-sensitive adhesive sheet (including a semiconductor-protective pressure-sensitive adhesive sheet and a semiconductor wafer-fixing sheet) at a light wavelength of from 300 to 400 nm was measured by a spectrophotometer ("MPS-2000" (using integrating sphere), trade name, manufactured by Shimadzu Corporation).

(2) Pressure-sensitive adhesive force stored under fluorescent lamp:

Each ultraviolet curing pressure-sensitive adhesive sheet in a form of a wound roll (including a semiconductor-protective pressure-sensitive adhesive sheet and a semiconductor wafer-fixing sheet) was exposed to a fluorescent lamp on a table separated from the fluorescent lamp at a distance of about 1.5 meters and after allowing to stand for a definite time, the pressure-sensitive adhesive force of the ultraviolet curing pressure-sensitive adhesive sheet after the irradiation of the ultraviolet rays (UV) was measured together with the pressure-sensitive adhesive force before the ultraviolet irradiation (the measuring instrument: a universal tensile compression tester, the releasing angle: 180° peeling, the releasing speed: 300 mm/minute, the adherend: silicon wafer, sample width: 25 mm, aging time after adhering: 30 minutes, and the measuring environment: 23° C./60% RH).

(3) Dicing property stored under fluorescent lamp:

According to the evaluation method (2), each ultraviolet curing pressure-sensitive adhesive sheet (including a semiconductor wafer-fixing pressure-sensitive adhesive sheet) was stored under a fluorescent lamp and thereafter, by using the sheet, a 4 inch semiconductor wafer was actually diced to 0.8 mm square. After completion of dicing, the scattered number [number/4 inch wafer] of the chips including surrounding chips was counted.

(4) Pick up property stored under fluorescent lamp:

According to the evaluation method (2), each ultraviolet curing pressure-sensitive adhesive sheet (including a semiconductor wafer-fixing pressure-sensitive adhesive sheet) was stored under a fluorescent lamp and thereafter, by using the sheet, a 4 inch semiconductor wafer was actually diced to 0.8 mm square. After completion of dicing, a UV irradiation was carried out and a picking up was carried out by a die bonder. The pick up rate (good/try) at that time was measured (needle plunge up lift: 0.9 mm).

The evaluation results obtained are shown in Table 1 to Table 3 below. In addition, the results of (1) the measurement of the ultraviolet transmittances are shown in Table 2, the results of (2) the pressure-sensitive adhesive forces stored under a fluorescent lamp are shown in Table 2, the results of measuring (3) the dicing property stored under a fluorescent lamp and (4) the pick up property stored under a fluorescent lamp are shown in Table 3. Further, the numerals "0", "7" and "14" at the left column in Table 3 show the storage time (hours).

TABLE 1

| | Transmittance [%] | | | | | | | | | |
|---|---|---|---|---|---|---|---|---|---|---|
| | Example | | | | | | | | Comparative Example | |
| Wavelength [nm] | 1 | 2 | 3 | 4 | 5 | 6 | 7 | 8 | 1 | 2 |
| 300 | 1 | 1 | 0 | 0 | 1 | 1 | 0 | 0 | 2 | 91 |
| 310 | 1 | 1 | 0 | 0 | 1 | 2 | 0 | 0 | 3 | 91 |
| 320 | 3 | 3 | 0 | 0 | 29 | 30 | 0 | 0 | 57 | 91 |
| 330 | 3 | 5 | 0 | 0 | 38 | 38 | 0 | 0 | 75 | 91 |

TABLE 1-continued

| | Transmittance [%] | | | | | | | | | |
|---|---|---|---|---|---|---|---|---|---|---|
| | Example | | | | | | | | Comparative Example | |
| Wavelength [nm] | 1 | 2 | 3 | 4 | 5 | 6 | 7 | 8 | 1 | 2 |
| 340 | 2 | 3 | 0 | 0 | 39 | 40 | 0 | 0 | 78 | 92 |
| 350 | 1 | 3 | 0 | 0 | 40 | 42 | 0 | 0 | 80 | 92 |
| 360 | 2 | 4 | 0 | 0 | 41 | 43 | 0 | 0 | 82 | 92 |
| 370 | 3 | 6 | 0 | 0 | 42 | 46 | 0 | 0 | 84 | 92 |
| 380 | 9 | 13 | 0 | 0 | 43 | 48 | 0 | 0 | 85 | 92 |
| 390 | 30 | 28 | 0 | 0 | 43 | 51 | 0 | 0 | 85 | 92 |
| 400 | 60 | 62 | 0 | 0 | 43 | 55 | 0 | 61 | 86 | 93 |

TABLE 2

| | | Pressure-sensitive adhesive force stored under fluorescent lamp [g/25 mm] | | | | | | | | | |
|---|---|---|---|---|---|---|---|---|---|---|---|
| Storage | | Example | | | | | | | | Comparative Example | |
| Time [hour] | | 1 | 2 | 3 | 4 | 5 | 6 | 7 | 8 | 1 | 2 |
| 0 | Before UV | 400 | 400 | 400 | 400 | 400 | 400 | 400 | 400 | 400 | 400 |
| | After UV | 8 | 8 | 8 | 8 | 8 | 8 | 8 | 8 | 8 | 8 |
| 7 | Before UV | 400 | 400 | 400 | 400 | 400 | 400 | 400 | 400 | 360 | 340 |
| | After UV | 10 | 11 | 8 | 8 | 13 | 12 | 8 | 8 | 21 | 25 |
| 14 | Before UV | 400 | 400 | 400 | 400 | 400 | 400 | 400 | 400 | 340 | 310 |
| | After UV | 11 | 14 | 8 | 8 | 15 | 15 | 8 | 8 | 39 | 45 |

TABLE 3

| | | Example | | | | | | | | Comparative Example | |
|---|---|---|---|---|---|---|---|---|---|---|---|
| | | 1 | 2 | 3 | 4 | 5 | 6 | 7 | 8 | 1 | 2 |
| Chip scattered number | 0 | 63 | 61 | 64 | 66 | 62 | 68 | 65 | 64 | 63 | 64 |
| | 7 | 60 | 65 | 61 | 63 | 67 | 64 | 61 | 60 | 91 | 107 |
| | 14 | 64 | 62 | 64 | 62 | 64 | 64 | 67 | 61 | 122 | 143 |
| Pick up rate [good/try] | 0 | 20/20 | 20/20 | 20/20 | 20/20 | 20/20 | 20/20 | 20/20 | 20/20 | 20/20 | 20/20 |
| | 7 | 20/20 | 20/20 | 20/20 | 20/20 | 20/20 | 20/20 | 20/20 | 20/20 | 18/20 | 14/20 |
| | 14 | 20/20 | 20/20 | 20/20 | 20/20 | 20/20 | 20/20 | 20/20 | 20/20 | 11/20 | 8/20 |

As is clear from Table 1 to Table 3, by using the ultraviolet curing pressure-sensitive adhesive sheets (including the semiconductor-protecting pressure-sensitive adhesive sheets and the semiconductor wafer-fixing sheets) of the Examples, the change in the pressure-sensitive adhesive properties is less and the stabilized grinding operation, dicing operation, and pick up operation can be carried out even under the circumstance of being exposed under a fluorescent lamp for a long time. On the other hand, in the case of using the ultraviolet curing pressure-sensitive adhesive sheets (including the semiconductor-protecting pressure-sensitive adhesive sheets and the semiconductor wafer-fixing sheets) of the Comparative Examples using the ordinary separators, the change in the pressure-sensitive adhesive properties is large, and the grinding, dicing, and pick up characteristics are inferior.

While the invention has been described in detail and with reference to specific embodiments thereof, it will be apparent to one skilled in the art that various changes and modifications can be made therein without departing from the spirit and scope thereof.

What is claimed is:

1. An ultraviolet curing pressure-sensitive adhesive sheet comprising a substrate film, an ultraviolet curing pressure-sensitive adhesive layer formed on at least one surface thereof, and a separator adhered to the surface of the pressure-sensitive adhesive layer, wherein the separator has an ultraviolet transmittance at a wavelength of 300 to 400 nm of 65% or lower.

2. The ultraviolet curing pressure-sensitive adhesive sheet as claimed in claim 1, wherein the separator is a plastic film having the ultraviolet transmittance at a wavelength of 300 to 400 of 65% or lower as the self-acquired property.

3. The ultraviolet curing pressure-sensitive adhesive sheet as claimed in claim 1, wherein the separator has a layer containing an ultraviolet absorber, formed on the surface thereof opposite the surface to which the pressure-sensitive adhesive layer is adhered.

4. The ultraviolet curing pressure-sensitive adhesive sheet as claimed in claim 1, wherein the separator is a film containing an ultraviolet absorber in the inside thereof.

5. The ultraviolet curing pressure-sensitive adhesive sheet as claimed in claim 1, wherein the separator has a layer containing an ultraviolet absorbing dyestuff, formed on the surface thereof opposite the surface adhering to the pressure-sensitive adhesive layer.

6. The ultraviolet curing pressure-sensitive adhesive sheet as claimed in claim 1, wherein the separator is a film having dispersed in the inside thereof an ultraviolet absorbing dyestuff.

7. The ultraviolet curing pressure-sensitive adhesive sheet as claimed in claim 1, wherein the separator is a film wherein the surface opposite the surface adhering to the pressure-sensitive adhesive layer was subjected to an embossing treatment such that its haze value is at least 20%.

8. The ultraviolet curing pressure-sensitive adhesive sheet as claimed in claim 1, wherein the separator is a film having a layer of inorganic fine particles, formed on the surface thereof opposite the surface adhering to the pressure-sensitive adhesive layer.

9. The ultraviolet curing pressure-sensitive adhesive sheet as claimed in claim 1, wherein the separator is a film wherein the surface thereof opposite the surface adhering to the pressure-sensitive adhesive layer is subjected to a light-reflecting treatment.

* * * * *